United States Patent [19]

Sueda et al.

[11] Patent Number: 4,974,049

[45] Date of Patent: Nov. 27, 1990

[54] SEMICONDUCTOR INTEGRATED CIRCUIT CONFIGURED BY USING POLYCELL TECHNIQUE

[75] Inventors: Akihiro Sueda; Hiroaki Murakami; Hitoshi Kondoh, all of Yokohama, Japan

[73] Assignee: Kabushiki Kaisha Toshiba, Kawasaki, Japan

[21] Appl. No.: 180,675

[22] Filed: Apr. 7, 1988

Related U.S. Application Data

[63] Continuation of Ser. No. 709,107, Mar. 7, 1985, abandoned.

[30] Foreign Application Priority Data

Mar. 8, 1984 [JP] Japan .................................. 59-44602
Mar. 21, 1984 [JP] Japan .................................. 59-53806

[51] Int. Cl.$^5$ ........................ H01L 23/52; H01L 23/48
[52] U.S. Cl. ........................................ 357/45; 357/59; 357/68; 357/67; 357/71

[58] Field of Search ................... 357/42, 45, 59, 71, 357/68

[56] References Cited

U.S. PATENT DOCUMENTS

| | | | |
|---|---|---|---|
| 4,249,193 | 2/1981 | Balyoz et al. | 357/40 |
| 4,500,906 | 2/1985 | Ohno et al. | 357/71 |
| 4,716,452 | 12/1987 | Kondoh et al. | 357/59 |

FOREIGN PATENT DOCUMENTS 58-71652 4/1983 Japan .................................. 357/45

Primary Examiner—Rolf Hille
Assistant Examiner—S. V. Clark
Attorney, Agent, or Firm—Finnegan, Henderson, Farabow, Garrett, and Dunner

[57] ABSTRACT

A semiconductor integrated circuit device configurated by using a polycell technique in which the wiring between the cell arrays is provided by two aluminum layers. The layers are insulated from each other by an insulator.

8 Claims, 12 Drawing Sheets

FIG. 2B (PRIOR ART)
FIG. 2C (PRIOR ART)
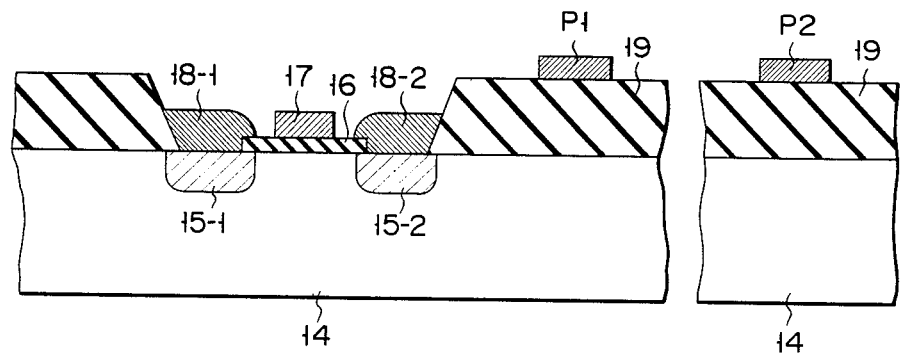
FIG. 3
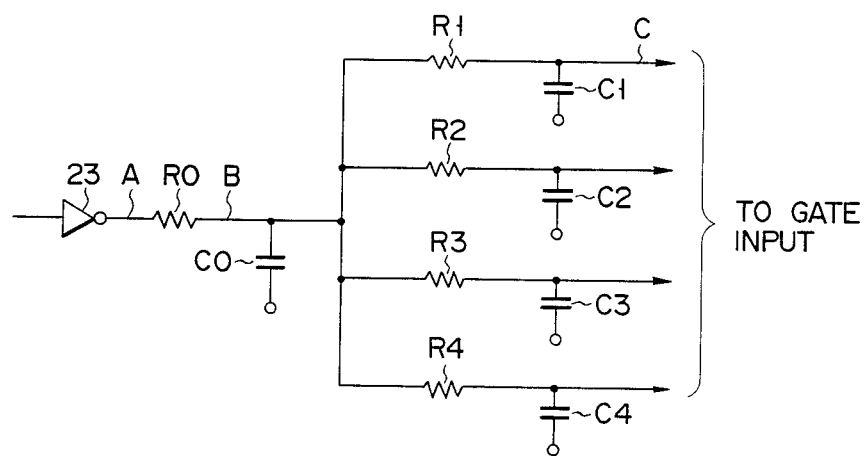

F I G. 7
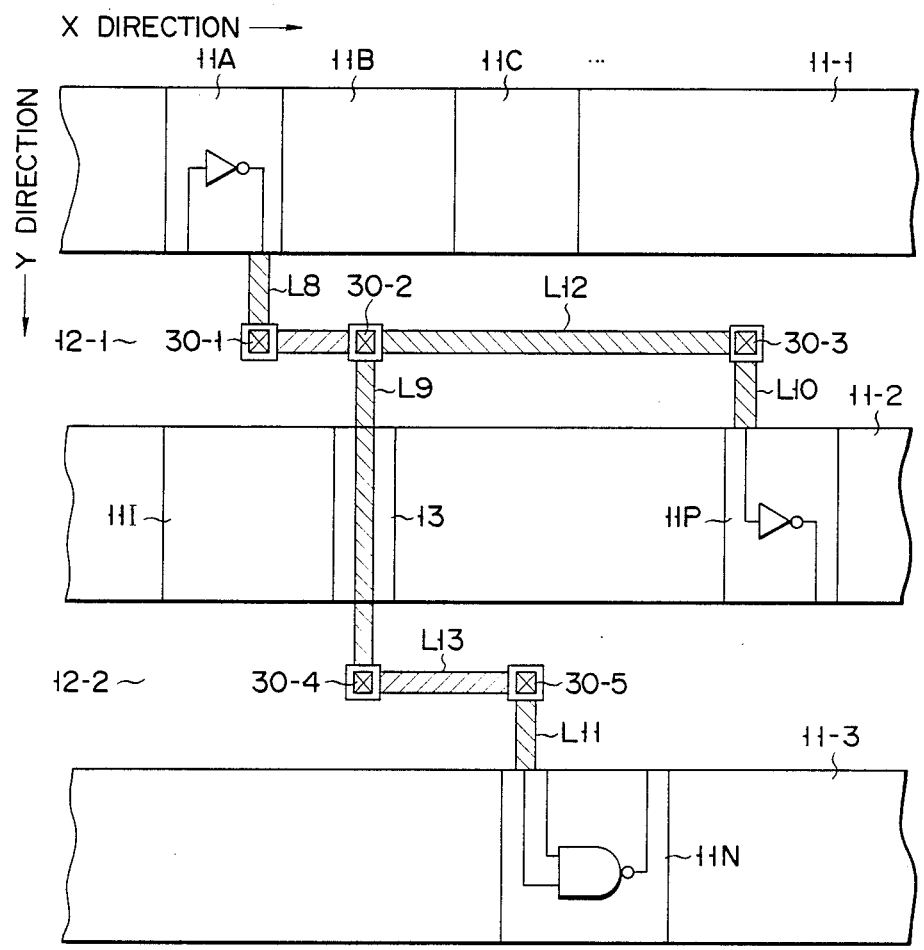

SEMICONDUCTOR INTEGRATED CIRCUIT CONFIGURED BY USING POLYCELL TECHNIQUE

This application is a continuation, of application Ser. No. 709,107, filed Mar. 7, 1985, now abandoned.

BACKGROUND OF THE INVENTION

The present invention relates to a semiconductor integrated circuit which is automatically designed by using a computer and, more particularly, to a large scale integrated circuit (LSI) manufactured using an aluminum wiring multilayer technique.

Automatic design of LSIs of this type adopts a so-called polycell technique. This technique is described in, e.g., "IEEE Journal of Solid-State Circuits" CH1726-9/82 pp. 111–114, 1982, and in Japanese Patent Application No. 51-74627 by the same applicant as of the present invention.

FIG. 1 schematically shows a plan view of an LSI pattern designed in accordance with the polycell technique. Each of the wiring regions (channel regions) 12-1, 12-2, . . . is disposed between each two adjacent cell arrays 11-1, 11-2, 11-3, . . . Each of the cell arrays 11-1, 11-2, 11-3, . . . is constructed by unit cells (logic circuit cells) 11A, 11B, 11C, . . . including various function circuits. These unit cells 11A, 11B, 11C, . . . are connected through the above channel regions 12-1, 12-2, . . . When wiring must be formed across the cell arrays, it is formed in the gaps 13 (through regions) between each two adjacent unit cells.

FIGS. 2A and 2B respectively show pattern structures of an inverter circuit as an example of the unit cells 11A. FIG. 2A is a pattern plan view, and FIG. 2B is a sectional view taken along a line X—X' of FIG. 2A. Impurity diffusion regions 15-1 and 15-2 as source and drain regions of a MOS transistor are formed in a major surface of semiconductor substrate 14. A gate insulating film 16 is formed on the semiconductor substrate 14 between the impurity diffusion regions 15-1 and 15-2. A gate electrode 17 is formed on the gate insulating film 16. Aluminum wiring layers 18-1 and 18-2 are formed on the impurity diffusion regions 15-1 and 15-2, respectively, so as to form contacts. A field oxide film 19 is selectively formed on the semiconductor substrate 14. An output wiring layer 20 of polysilicon is formed on the field oxide film 19. The wiring formed in the through regions 13 is formed by a polysilicon layer P2 on the field oxide film 19, as shown in FIG. 2C. Wiring layers 22-1 and 22-2, as shown in FIG. 2A, for supplying a power source voltage to the unit cells are formed of aluminum layers.

Since the unit cells with the above structure are laterally (or longitudinally) aligned so as to construct the cell array, in the semiconductor integrated circuit device shown in FIG. 1, the wiring layers parallel to the cell arrays 11-1, 11-2, 11-3, . . . (aligned along the X direction) are formed of aluminum wiring layers A1 to A3 and the wiring layers perpendicular thereto (Y direction) are formed of polysilicon wiring layers P1 to P4. Note that the aluminum wiring layers A1 to A3 and the polysilicon wiring layers P1 to P4 are connected by contact portions 10-1 to 10-5.

The above structure has the following disadvantages.

First, high speed operation is prevented by the resistance of the polysilicon wiring layer. This is because the sheet resistance of a polysilicon film is several tens of ohms/□ and is 100 times or more than that of the aluminum film. This wiring resistance causes a transfer delay of signals. The transfer delay is increased when the length of the through wiring layer P2 formed of polysilicon is increased. When the output wiring layer P1 is formed of polysilicon, the transfer delay of signals is further increased by the resistance thereof. As shown in FIG. 3, in the circuit arrangement having four fan-outs with respect to an inverter circuit 23, assume that an output resistance of the output wiring layer is represented by R0, input resistances of the input wiring layers connected to the next stage are represented by R1 to R4, a load capacitance of the wiring layers is represented by C0, load capacitances of the gates of the next stage are represented by C1 to C4, signal transmission time from a point A to a point C is represented by T1, and signal transmission time from a point B to a point C is represented by T2. The times T1 and T2 are respectively approximated by using the following equations (1) and (2):

$$T1 = C0 \cdot R0 + C1 \cdot R1 \qquad \ldots (1)$$

$$T2 = C1 \cdot R1 \qquad \ldots (2)$$

where in the case of the arrangement shown in FIG. 1, since $R0 \gg R1$ and $C0 \gg C1$ are established, relation $T1 > T2$ is also established. This means the influence of the output resistance R0 and the load capacitance C0 with respect to the signal transmission time is much larger than that of the resistance R1 and the capacitance C1. Particularly, in the arrangement shown in FIG. 1, due to the presence of the polysilicon through wiring layer P2, the output resistance cannot be decreased. In addition, when the number of fan-outs is increased, the load capacitance C0 becomes large, thus preventing high speed operation.

Second, when the wiring layer P2 is formed across the cell arrays 11-2, through regions 13 are required between each two adjacent unit cells. This prevents high integration.

Third, when positions of the through wiring layers P2 are determined, positions of the unit cells are undesirably shifted. Thus, neither the optimum position of the through wiring layer P2 nor the optimum algorithm of the wiring layers between the unit cells can be achieved. As a result, the wiring layers cannot be highly integrated. This can be easily understood from a comparison between wiring algorithms in the case wherein the positions of the unit cells are not shifted and in the case wherein the positions of the unit cells are shifted every time the through wiring layers are formed in automatic wiring.

As described above, in a conventional semiconductor integrated circuit device manufactured in accordance with the polycell technique, a high-speed and highly integrated device cannot be obtained.

SUMMARY OF THE INVENTION

It is, therefore, an object of the present invention to provide a high-speed and highly integrated semiconductor integrated circuit device which is manufactured by a polycell technique.

According to an aspect of the present invention, there is provided a semiconductor integrated circuit device which is formed in such a manner that a plurality of cell arrays each consisting of laterally (or longitudinally) aligned unit cells comprising function circuits are arranged to be spaced by a predetermined distance, and wiring layers are formed on regions between each two adjacent cell arrays so as to form wiring layers between the unit cells, wherein each wiring layer between the unit cells is formed of a two-layered metal layer whose upper and lower layers are insulated from each other.

With this arrangement, transfer delay of signals due to a wiring resistance can be reduced and no through region is needed, thus providing a high-speed and highly integrated semiconductor integrated circuit device.

BRIEF DESCRIPTION OF THE DRAWINGS

FIGS. 2A, 2B and 2C are respectively views for explaining a pattern arrangement of an example of a unit cell in the device of FIG. 1;

FIG. 3 is an equivalent circuit diagram for explaining transfer delay of signals in the device shown in FIG. 1;

FIGS. 6 and 7 are respectively views for explaining a semiconductor integrated circuit device according to other embodiments of the present invention;

DETAILED DESCRIPTION OF THE PREFERRED EMBODIMENTS

Figure 4:
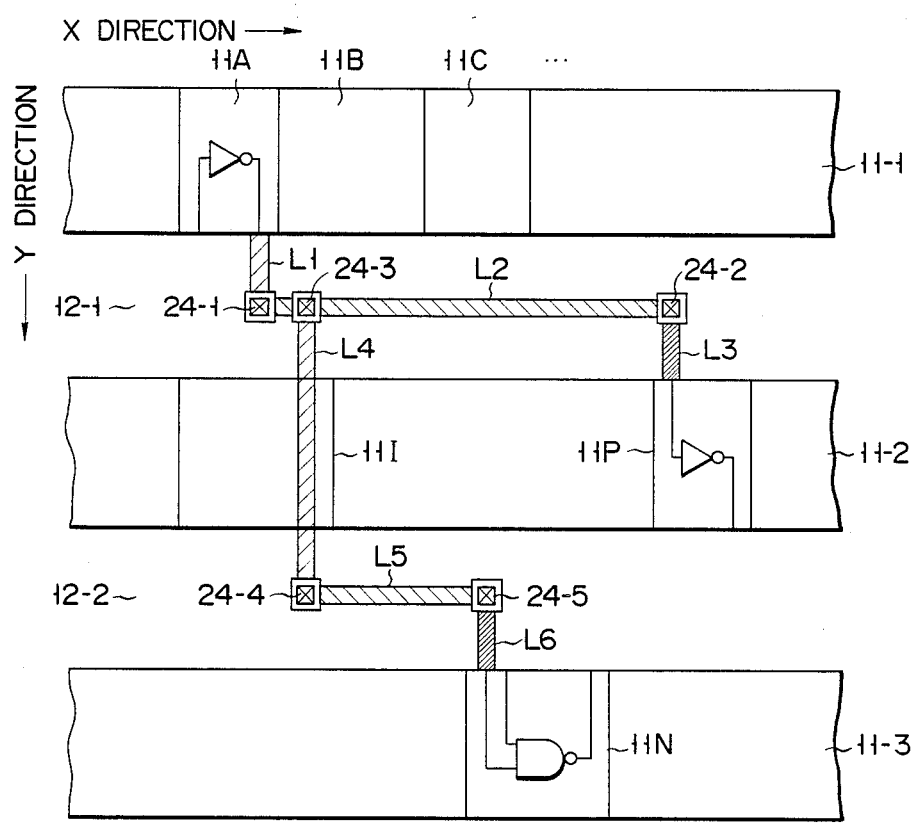
FIG. 4 is a view for explaining a semiconductor integrated circuit device according to an embodiment of the present invention.

FIG. 4 schematically shows a pattern plan view of a semiconductor integrated circuit device according to an embodiment of the present invention. This device is configurated using the polycell technique. Each of the wiring regions (channel regions) 12-1, 12-2, . . . is disposed between each two adjacent cell arrays 11-1, 11-2, 11-3, . . . Each of the cell arrays 11-1, 11-2, 11-3 is constructed by unit cells 11A, 11B, 11C, . . . as logic circuit blocks comprising function circuits. An output wiring layer of the unit cell 11A extends into the channel region 12-1 in the Y direction by a second aluminum wiring layer L1. The wiring layer L1 is connected through a contact region 24-1 to one end of a first aluminum wiring layer L2 which extends in the X direction. One end of a polysilicon wiring layer L3 is connected to the other end of the wiring layer L2 through a contact region 24-2. The polysilicon wiring layer L3 corresponds to an input gate of the unit cell 11P extending in the Y direction. One end of a second aluminum wiring layer through wiring layer L4 is connected to the first aluminum wiring layer L2 through a contact region 24-3. The wiring layer L4 extends in the Y direction through an insulating film on the unit cell 11I. The other end of the second aluminum wiring layer L4 is connected through a contact region 24-4 to one end of a first aluminum wiring layer L5 extending in the X direction. The other end of the wiring layer L5 is connected to one end of a polysilicon wiring layer L6 extending in the Y direction through a contact region 24-5. The other end of the polysilicon wiring layer L6 is connected to an input of the unit cell 11N.

Figure 1:
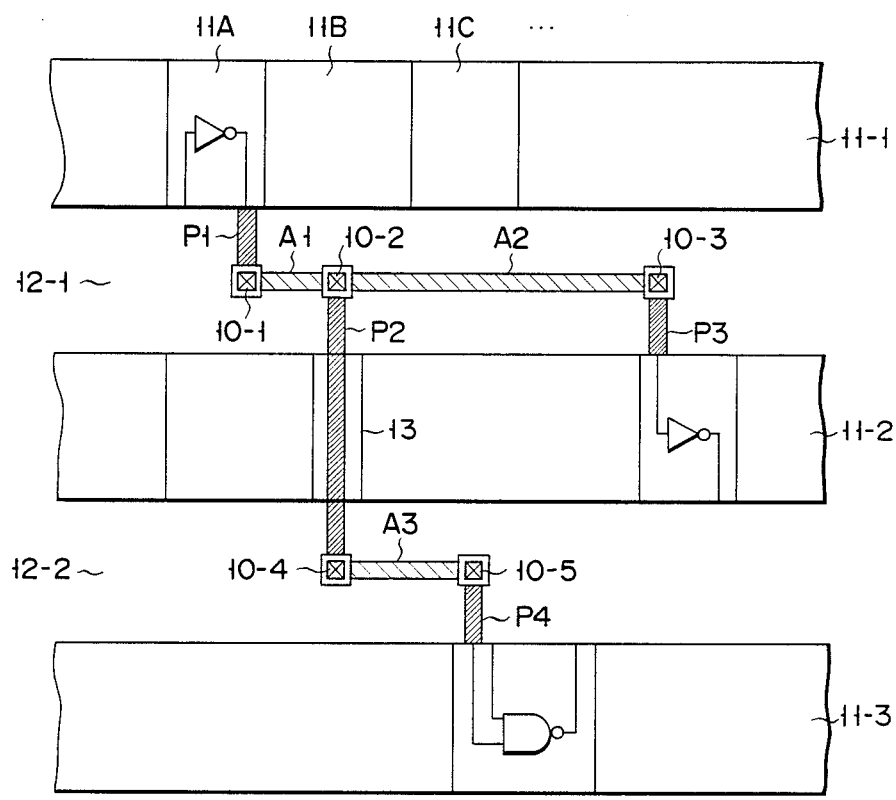
FIG. 1 is a view for explaining a conventional semiconductor integrated circuit device.
Figure 2A:
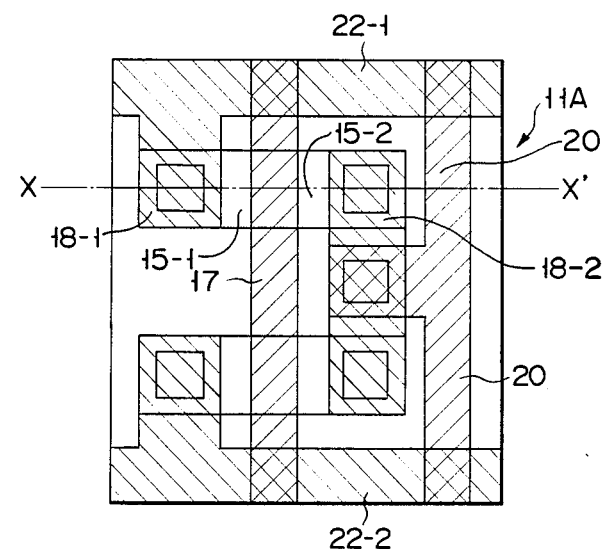
Figure 5A:
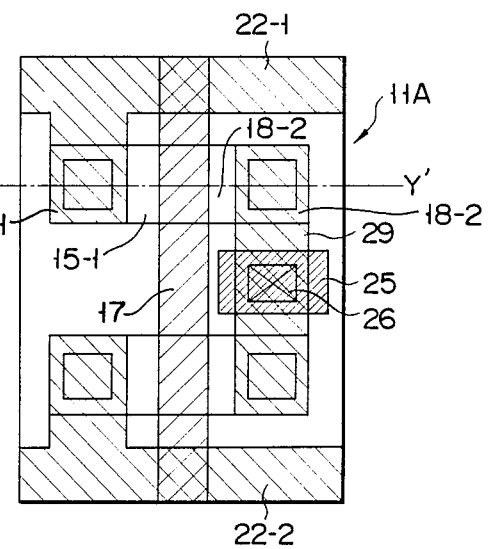
FIGS. 5A and 5B are respectively views for explaining a pattern arrangement of an inverter circuit as an example of a unit cell in the device of FIG. 4.
Figure 5B:
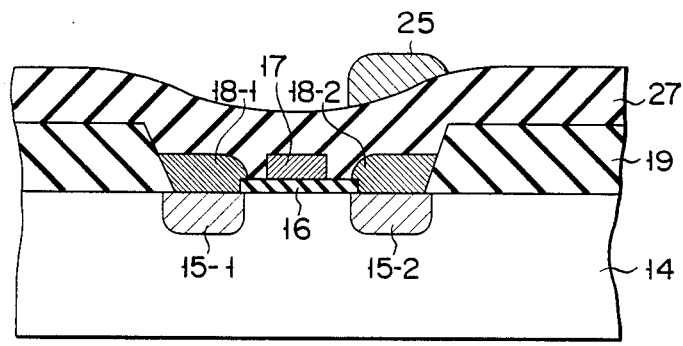

The through wiring layer L4 is formed on the insulating layer on the unit cell 11I so as not to contact the second aluminum wiring layer used in the unit cell 11I. In other words, a portion of the second aluminum wiring layer in the unit cell is isolated from the through wiring layer L4. An output line of the unit cell 11A for generating a signal is formed of the second aluminum wiring layer. For this reason, as shown in FIGS. 5A and 5B, a tap 25 using the second aluminum wiring layer is formed on a first aluminum wiring layer 29 as an output, and contacts the first and second aluminum wiring layers 29, 25. The same reference numerals as in FIGS. 2A and 2B denote the same parts in FIGS. 5A and 5B, and a detailed description thereof is omitted. A second aluminum wiring layer (top) 25 formed on an insulating layer 27 serves as an output wiring layer connecting an output provided in the unit cell 11A to other wiring layers L2, L4. In this case, wiring layers 22-1 and 22-2 formed of the first aluminum layers connect the cell unit to a power supply.

With this arrangement, since the output and through wiring layers of the unit cell are formed of aluminum layers having a low resistance, the output resistance R0 can be reduced and signal delay time is decreased, and high-speed operation can be obtained. Since the second aluminum layers are used as the through wiring layers so as to extend on the unit cell, a space constituting a through region therebetween is not required, and high integration can be achieved. Furthermore, since the positions of the unit cells are not shifted to allow for the through wiring layers, an optimum wiring algorithm can be easily achieved, thereby obtaining highly integrated wiring layers.

Furthermore, as an additional advantage, when the two aluminum wiring layers are used, the polysilicon wiring layers can overlap the second aluminum wiring layers (without short-circuiting) and different signal lines can be formed on a single mesh (wiring track), thus achieving highly integrated wiring layers. When the second aluminum wiring layers are used as the output signal line from the unit cell, it can be formed on the drain of the unit cell. As a result, regions shown in FIG. 2 for connecting the first aluminum wiring layers and the polysilicon wiring layers in order to generate the output (drain) from the unit cells are not needed, and a pattern area of each unit cell can be reduced, as shown in FIG. 5.

In the above embodiment, the second aluminum wiring layers are used as the through wiring layers and the output wiring layers from the unit cell. However, the first aluminum wiring layers can be used instead of these layers. In this case, portions of the first aluminum wiring layers are formed of the second aluminum wiring layers.

Figure 6:
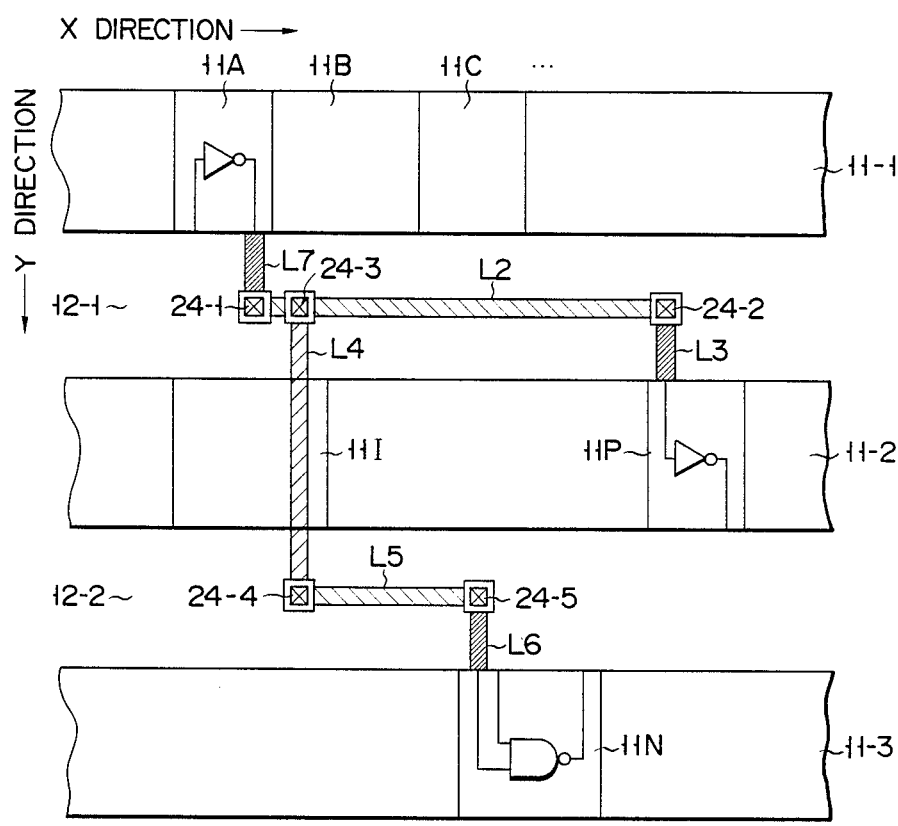

FIG. 6 shows a semiconductor integrated circuit device according to another embodiment of the present invention. In the above embodiment, the second aluminum wiring layers are used for the through wiring layers and are formed on the unit cells through the insulating layer, and the second aluminum wiring layers are used for the output wiring layers from the unit cells. In this embodiment, a polysilicon wiring layer L7 is used for the output wiring layer from the unit cell 11A. The same reference numerals as in FIG. 4 denote the same parts in FIG. 6, and a detailed description thereof is omitted.

With this arrangement, when the through wiring layers L4 are formed, an isolated region in the unit cell 11I across which the wiring layer cannot be formed is not required, thus allowing the through wiring layers L4 to be formed with respect to the overall region of the cell array. Therefore, the wiring algorithm can be more easily achieved in comparison to the embodiment described with reference to FIG. 4.

FIG. 7 shows a semiconductor integrated circuit device according to still another embodiment of the present invention. In this embodiment, first aluminum wiring layers L8, L9, L10, and L11 are used for wiring layers along the Y direction, and second aluminum wiring layers L12 and L13 are used for wiring layers along the X direction. No polysilicon wiring layer is used between the unit cells. These wiring layers are connected through contact regions 30-1 to 30-5. The second aluminum wiring layer L12 is connected to the first aluminum wiring layers L8, L9, and L10 through contact regions 30-1, 30-2, and 30-3, respectively. The second aluminum wiring layer L13 is connected to the first aluminum wiring layers L9 and L11 through contact regions 30-4 and 30-5, respectively. With the above arrangement, since the first aluminum wiring layers along the Y direction cross power supply aluminum wiring layers in the unit cells, second aluminum wiring layers 31-1 and 31-2 are used for power supply lines, as shown in a pattern plan view of FIG. 8. Note that reference numerals 32-1 to 32-6 denote first aluminum wiring layers; and 33, a polysilicon wiring layer.

With this arrangement, when the wiring layers cross the cell array, a through region 13 is required. However, since the through wiring layer L9 and the output wiring layer L8 of the unit cell are formed of the aluminum wiring layers, a high-speed device can be obtained.

Figure 9:
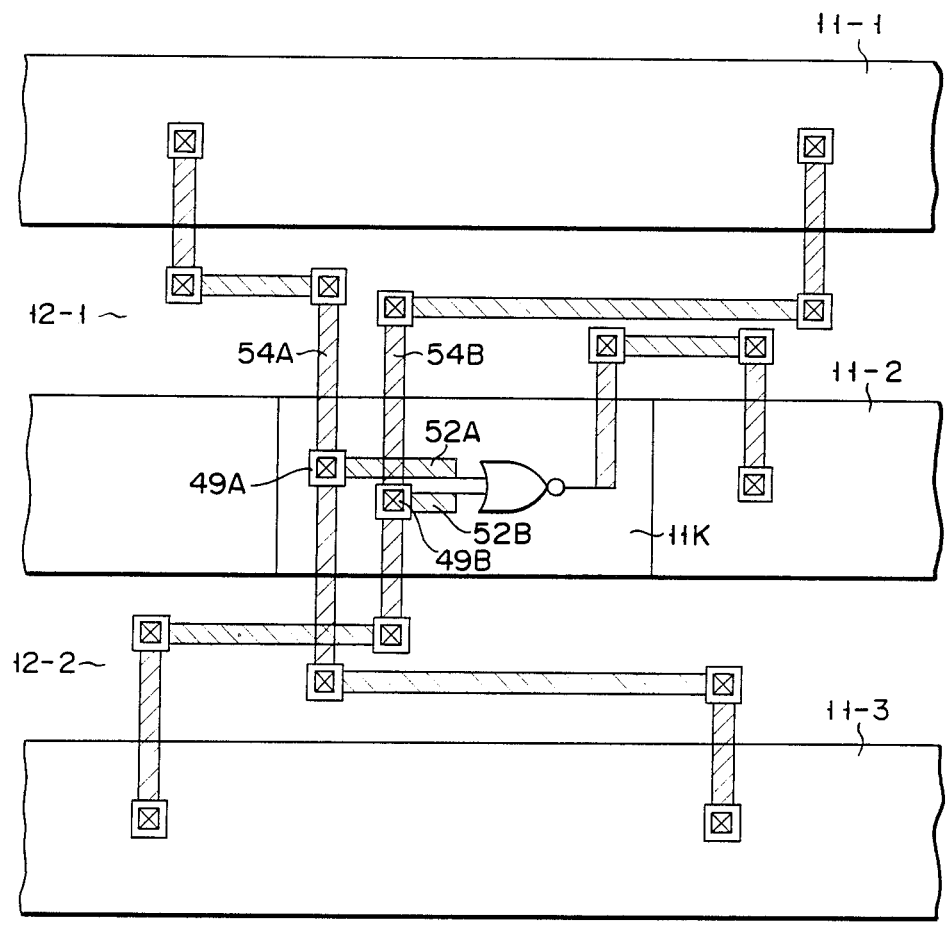
FIG. 9 is a view for explaining a semiconductor integrated circuit device according to still another embodiment of the present invention.
Figure 10:
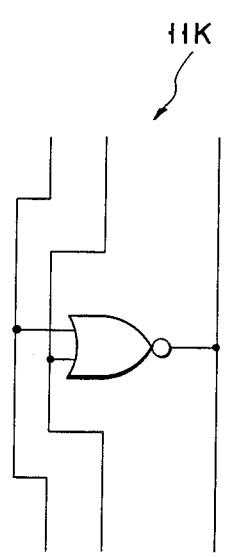
FIG. 10 is a view showing a NOR gate as an example of a unit cell in FIG. 9.
Figure 12:
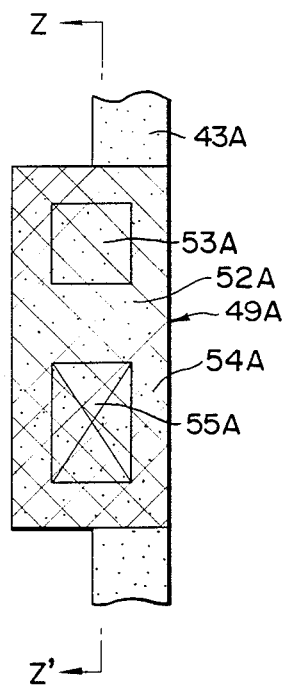
FIG. 12 is an enlarged view of a contact region in FIG. 11.
Figure 13:
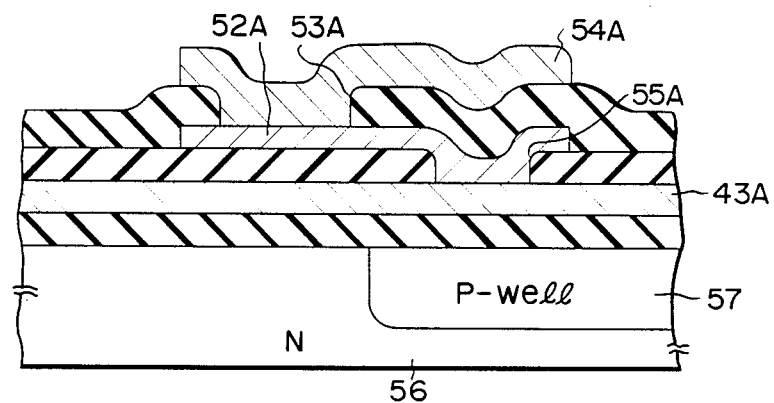
FIG. 13 is a sectional view of FIG. 12.
Figure 11:
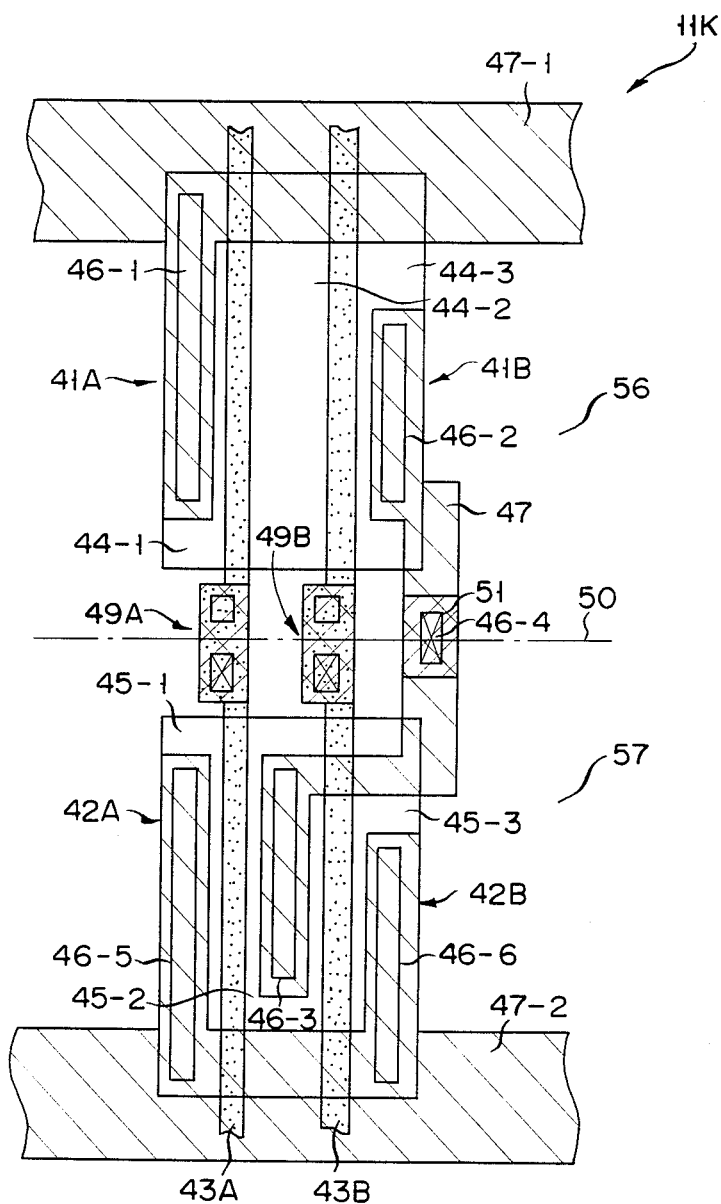
FIG. 11 is a plan view showing a pattern arrangement of FIG. 10.

FIG. 9 shows still another embodiment of the present invention. A difference between the embodiments shown in FIGS. 7 and 9 is that the second aluminum wiring layers are used for wiring layers along the Y direction, and the first aluminum wiring layers are used for wiring layers along the X direction, and the wiring layers are connected to the input and output terminals at the center of each unit cell. FIG. 10 shows a 2-input NOR gate as an example of the unit cell 11K shown in FIG. 9. FIG. 11 shows a pattern plan view when the 2-input NOR gates of FIG. 10 construct a complementary device using MOSFETs. FIG. 12 is an enlarged view of a contact region 49A in FIG. 11. FIG. 13 is a sectional view taken along a line Z-Z' of FIG. 12. Polysilicon gate electrodes 43A and 43B partially used for wiring layers are formed on regions for forming p-channel MOSFETs 41A and 41B and n-channel MOSFETs 42A and 42B, respectively. The gate electrodes 43A and 43B are formed so as to extend through the cell arrays. The p-type impurity diffusion regions 44-1 and 44-2 as a source and a drain of the MOSFET 41A are formed at two sides of the gate electrode 43A. The impurity diffusion region 44-2 also serves as a source of the MOSFET 41B. A p-type impurity diffusion region 44-3 is formed as the drain of the MOSFET 41B. An n-type impurity diffusion region 45-1 is formed as the source of the MOSFET 42A, an n-type impurity diffusion region 45-2 is formed as a common drain of the MOSFETs 42A and 42B, and an n-type impurity diffusion region 45-3 is formed as the source of the MOSFET 42B. The impurity diffusion region 44-1 is connected through a contact portion 46-1 to a power supply line 47-1 formed of the first aluminum wiring layer. The impurity diffusion region 44-3 is connected to one end of a first aluminum wiring layer 47 through a contact portion 46-2. The other end of the wiring layer 47 is connected to an impurity diffusion region 45-2 through a contact portion 46-3. A contact region 51 is formed on a boundary between a side end portion of a well region in the wiring layer 47 and a semiconductor substrate (indicated by an alternate long and short dashed line 50), and contacts the wiring layer 47 (the first aluminum layer) and a contact region 51 through a contact region 46-4. The impurity diffusion regions 45-1 and 45-3 are connected to a ground line 47-2 formed of a first aluminum wiring layer through contact regions 46-5 and 46-6, respectively.

FIG. 12 is an enlarged view of a contact region 49A in FIG. 11, and FIG. 13 is a sectional view taken along a line Z—Z' in FIG. 12. A first aluminum wiring layer 52A is connected to a second aluminum wiring layer 54A through a contact hole 53A and is connected to the gate electrode 43A of the polycrystalline silicon film through a contact hole 55A. The contact region 49A is formed on a boundary between an n-type semiconductor substrate 56 and one end portion of a well region 57 formed in one major surface of the substrate 56 (indicated by the alternate long and short dashed line 50).

The contact region 49A of the unit cell 11K with the above structure will be described hereinafter. An input signal is supplied to the unit cell through the second aluminum wiring layer 54A, and is connected to the first aluminum wiring layer 52A through the contact region 49A. Furthermore, the input signal is supplied to the gate electrode 43A. An output signal is supplied to the contact region 51 through the contact portion 46-4 from the first aluminum wiring layer 47 connecting the p-type and n-type impurity diffusion regions 44-3 and 45-2.

Figure 8:
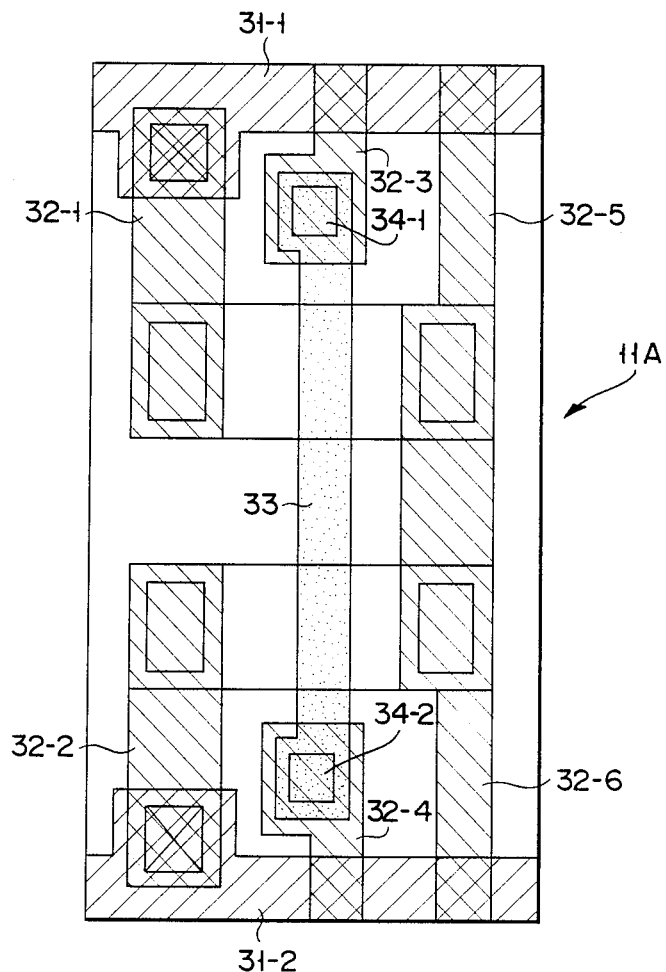
FIG. 8 is a view for explaining a pattern arrangement of an inverter circuit as an example of a unit cell in the device of FIG. 7.

With this arrangement, connections between the first and second aluminum wiring layers 52A, 54A and between the wiring layer of the first aluminum layer 52A and the gate electrodes 43A and 43B are formed on the boundary between the semiconductor substrate 56 and the side end portion of the p-type well region 57 through a field oxide film. Therefore, additional space is not required. Thus, higher integration can be achieved in comparison to the case where contacts 34-1, 34-2 are formed at two sides of the unit cell, as shown in FIG. 8. In addition, within the same pattern area, a channel width of the MOSFET can be enlarged, increase a mutual conductance gm the MOSFET.

The polysilicon layer film is used only for connecting the second aluminum wiring layers other than the gate electrodes. For this reason, when the polysilicon layer is used for through wiring to transmit an input signal from the p-channel region to the n-channel region or from n-channel region to the p-channel region, a wiring resistance due to the polysilicon layer does not occur, thus achieving high-speed operation. As described above, a contact between the gate electrodes 43A and 43B and the second aluminum wiring layers 54A is formed on a junction region between the side end portion of the well region 57 and the semiconductor substrate 56. For this reason, signal transmission to the gates at the p-channel and n-channel sides can be performed at substantially the same speed and along the shortest path, thereby realizing a high-speed operation.

Figure 14:
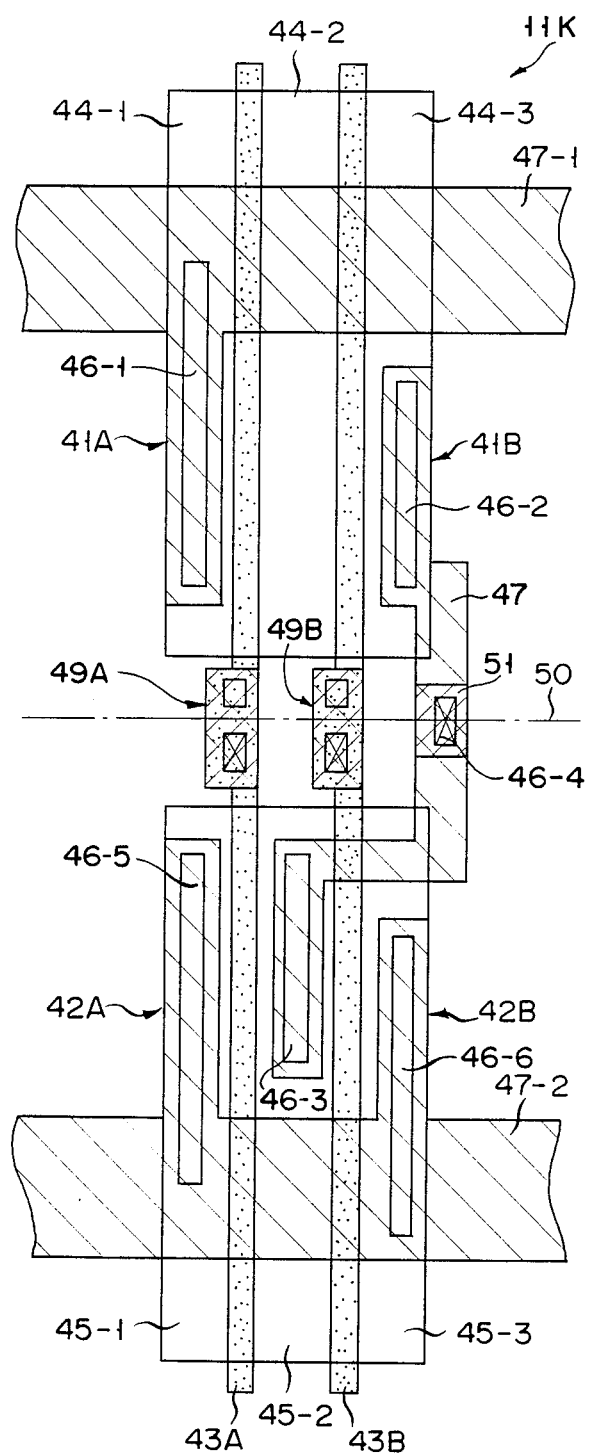
FIG. 14 is a view showing another pattern arrangement of FIG. 10.

Furthermore, since only the first and second aluminum wiring layers are used for the wiring regions outside the unit cells, in order to increase a mutual conductance gm of the MOSFETs, the gate electrodes 43A and 43B and the sources and drains 44-1 to 44-3 and 45-1 to 45-3 can extend outside the respective unit cells (outside the power supply line 47-1 and the ground line 47-2), as shown in FIG. 14. The same reference numerals in FIG. 14 denote the same parts in FIG. 11. In this case, wiring regions of the first and second aluminum wiring layers are formed on the gate electrodes 43A and 43B and the sources and drains 44-1 to 44-3 and 45-1 to 45-3 through the insulating layer so as to facilitate high integration.

Figure 15:
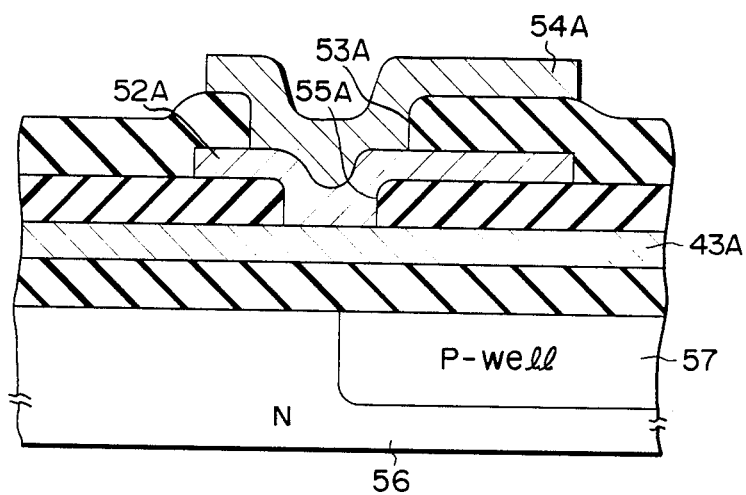
FIG. 15 is a sectional view showing another arrangement of the contact region in FIG. 11.

In the embodiments described with reference to FIGS. 9 to 14, the contact hole 55A for connecting the polysilicon layer 43A and the first aluminum wiring layer 52A and the contact hole 53A for connecting the second aluminum wiring layer 54A and the first aluminum wiring layer 52A are formed at different positions. However, as shown in FIG. 15, the contact holes 53A and 55A can be aligned only vertically. In other words, the contact hole 53A can be formed on the contact hole 55A. Since the positions of the contact holes 53A and 55A coincide with each other, easier pattern layout can be performed in comparison to the above embodiments.

Figure 16A:
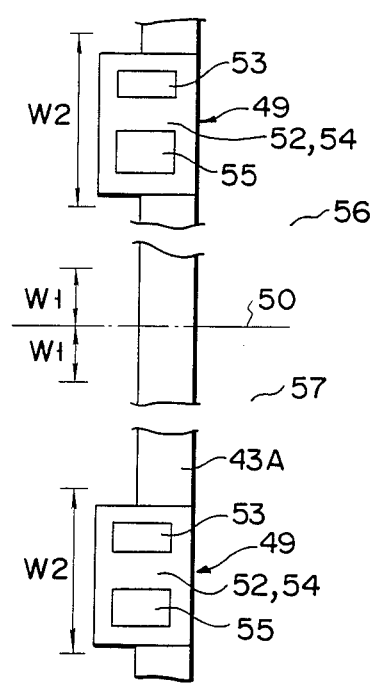
FIGS. 16A and 16B are respectively views for explaining an effect of the structure according to the embodiment shown in FIG. 9.
Figure 16B:
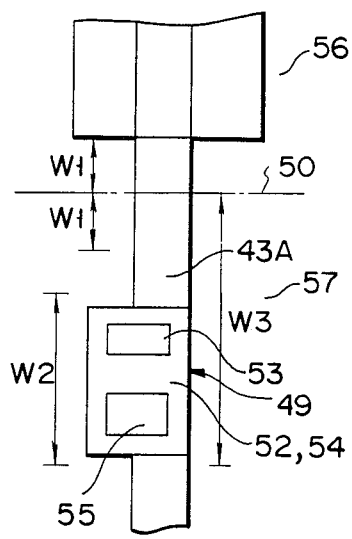

In the above embodiments, connections between the first and second aluminum wiring layers 52A, 54A and the gate electrodes 43A are formed on the boundary region between the semiconductor substrate 56 and the side end portion of the well region 57. The present invention is not limited to this. For example, the first and second aluminum wiring layers 52A, 54A and the gate electrodes 43A can be connected at positions slightly separated from the boundary between the semiconductor substrate 56 and the well region 57. This modification will be described hereinafter with reference to pattern plan views shown in FIGS. 16A and 16B. Note that FIG. 16A shows a case wherein the contacts are provided at two sides of the unit cell, and FIG. 16B shows a case wherein the contact is provided at a position in the vicinity of the boundary between the semiconductor substrate 56 and the well region 57. In FIGS. 16A and 16B, reference symbol W1 denotes a distance between a side end portion of the well region 57 and prospective regions of the sources and the drains and the gate electrodes in the surface region of the well region (or that of the semiconductor substrate 56). Reference symbol W2 denotes a width required for connecting the second and first aluminum wiring layers 52, 54 and the gate electrodes 43. Reference symbol W3 denotes a distance between the side end portion of the well region 57 and an edge of the contact hole 53, 55. Assuming that a sum of the width required for the boundary region between the semiconductor substrate 56 and the well region 57 and the width required for connecting the first and second aluminum wiring layers 52, 54 and the gate electrodes 43A is given by Yi, in FIGS. 16A and 16B, the following equations are respectively provided:

$$Y1 = (W1 \times 2) + (W2 \times 2) = 2W1 + 2W2 \quad \ldots (3)$$

$$Y2 = W1 + W3 \quad \ldots (4)$$

where if Y2 < Y1, from the above equations (3) and (4), the following inequality is obtained:

$$W3 < W1 + 2W2 \quad \ldots (5)$$

In other words, integration of the device can be further improved when the distance between the side end portion of the well region and the far edge of the contact hole is shorter than a value obtained by adding the distance between the side end portion of the well region and the prospective region of the source and drain regions and the gate electrodes to a value twice the width required for connecting the first and second aluminum wiring layers and the gate electrodes.

It should be noted that in the above embodiments, aluminum is used for the material of the first and second metal wiring layers. However, other metals having a low resistance can be used instead of aluminum.

Figure 17:
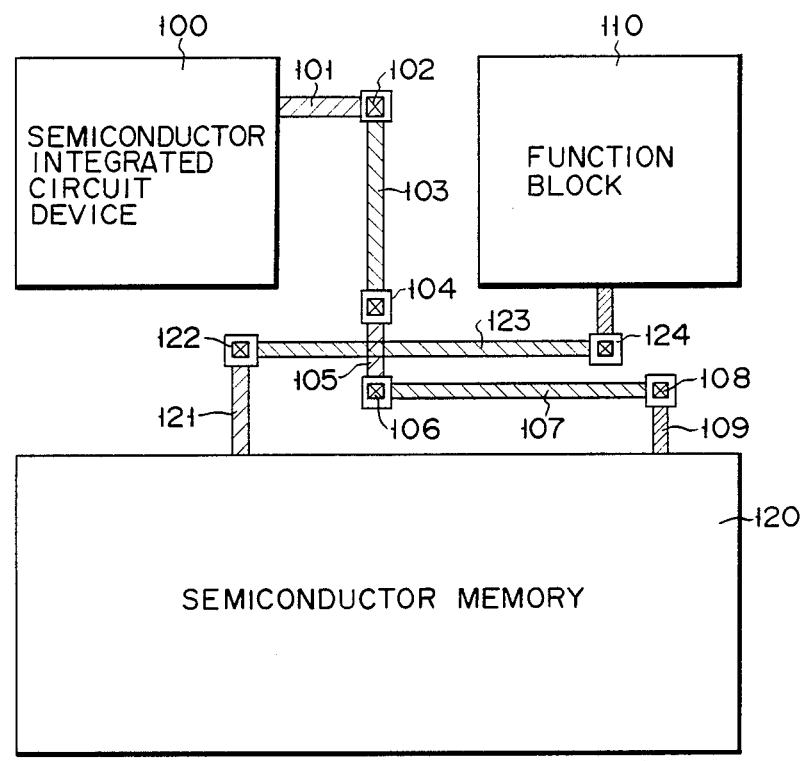
FIG. 17 is a view for explaining a semiconductor integrated circuit device according to still another embodiment of the present invention.

In the above embodiments, the case wherein a two-layered metal wiring layer is applied to a single semiconductor integrated circuit device configurated by using the polycell technique has been described. However, as shown in FIG. 17, a semiconductor integrated circuit device 100 formed in accordance with the above embodiments can be connected to a function block 110 having a local system function and a semiconductor memory 120 such as a RAM, ROM, and the like. The output from the device 100 is obtained through a second aluminum wiring layer 101 and is connected to one end of a first aluminum wiring layer 103 through a contact portion 102. The other end of the wiring layer 103 is connected to one end of a second aluminum wiring layer 105 through a contact portion 104. The other end of the wiring layer 105 is connected to one end of a first aluminum wiring layer 107 through a contact portion 106. The other end of the wiring layer 107 is connected to an input gate (polysilicon layer) of the memory 120 through a contact portion 108. The output from the memory 120 is obtained through a second aluminum wiring layer 121 and is connected to one end of a first aluminum wiring layer 123 through a contact portion 122. The other end of the wiring layer 123 is connected to an input gate (polysilicon layer) of the function block 110 through a contact portion 124.

With this arrangement, signal transmission delay time between the device 100, the function block 110 and the memory 120 can be reduced, thus achieving high-speed operation.

What is claimed is:

1. A semiconductor integrated circuit device configurated by using a polycell technique, comprising:
   a plurality of cell arrays each extending in a first direction;
   wiring regions each of which is provided between each two adjacent cell arrays;
   a first unit cell included in one of said cell arrays;
   a second unit cell included in one of the cell arrays which adjoins a first wiring region adjacent to the cell array including said first unit cell;

a third unit cell included in a cell array which is separated by at least one cell array from the cell array included said first unit cell;

a first metal wiring layer formed by extending an output wiring layer of said first unit cell into the first wiring region in a second direction perpendicular to said cell arrays;

a second metal wiring layer positioned at a level different from said first metal wiring layer and extending within the first wiring region in the first direction;

a first contact region connecting the first metal wiring layer to the second metal wiring layer;

a first polysilicon wiring layer formed by extending an input wiring layer of said second unit cell into the first wiring region in the second direction;.

a second contact region connecting said second metal wiring layer to said first polysilicon wiring layer;

a through wiring layer formed of metal and being flush with said first metal wiring layer, said through wiring layer extending in the second direction above the at least one cell array between the cell array including said first unit cell and the cell array including said third unit cell;

a third contact region connecting said second metal wiring layer to said through wiring layer;

a third metal wiring layer flush with said second metal wiring layer and extending in the first direction into a second wiring region adjoining the cell array including said third unit cell;

a fourth contact region connecting said through wiring layer to said third metal wiring layer;

a second polysilicon wiring layer flush with said first polysilicon wiring layer and formed by extending an input wiring layer of the third unit cell into the second wiring region in the second direction; and a fifth contact region connecting said third metal wiring layer to said second polysilicon wiring layer.

2. A device according to claim 1, wherein said second and third metal wiring layers constitute one layer of a double-layer wiring structure containing aluminum, and said first metal wiring layer and said through wiring layer constitute the other layer of the double-layer wiring structure.

3. A device according to claim 2, wherein said second and third metal wiring layers constitute a lower layer of the double-layer wiring structure, and said first metal wiring layer and said through wiring layer constitute an upper layer of the double-layer wiring structure.

4. A device according to claim 2, wherein said first metal wiring layer and said through wiring layer constitute a lower layer of the double-layer wiring structure, and said second and third metal wiring layers constitute an upper layer of the double-layer wiring structure.

5. A CMOS type semiconductor integrated circuit device configured by using a polycell technique, comprising:

a plurality of cell arrays each extending in a first direction;

wiring regions each of which is provided between each two adjacent cell arrays;

a unit cell included in one of said cell arrays;

a semiconductor substrate which has a major surface and on which said unit cell is formed;

a well region formed within the major surface of said semiconductor substrate;

a function circuit included in said unit cell and comprising MOS transistors formed in the semiconductor substrate and the well region, said MOS transistors having gate electrodes formed on the well region in said unit cell and on the semiconductor substrate with a first insulating layer interposed therebetween;

a second insulating layer formed on the gate electrode and the first insulating layer;

a first metal wiring layer formed on the second insulating layer;

a first contact region formed in the second insulating layer in the proximity of a boundary between a side end portion of the well region and the semiconductor substrate and connecting the gate electrode to the first metal wiring layer;

a second metal wiring layer formed on the first metal wiring layer with a third insulating layer interposed therebetween; and a second contact region formed in the third insulating layer in the proximity of a boundary between the well region and the semiconductor substrate and connecting the first metal wiring layer to the second metal wiring layer.

6. A device according to claim 5, wherein said first and second contact regions are located on the boundary between the side end portion of the well region and the semiconductor substrate and are aligned in a direction perpendicular to the major surface of the semiconductor substrate.

7. A device according to claim 5, wherein a distance between the side end portion of said well region and a remoter edge of the first and second contact regions is shorter than a value obtained by adding a distance between the side end portion of said well region and a prospective region for forming source and drain regions and said gate electrode to a value twice the width required for connecting said first and second metal wiring layers and said gate electrode.

8. A device according to claim 5, wherein said first and second metal wiring layers are each made of a layer containing aluminum.

* * * * *

UNITED STATES PATENT AND TRADEMARK OFFICE
CERTIFICATE OF CORRECTION

PATENT NO. : 4,974,049
DATED : November 27, 1990
INVENTOR(S) : Akihiro Sueda et al It is certified that error appears in the above-identified patent and that said Letters Patent is hereby corrected as shown below:

On the title page, in item [54] and in column 1, line 3:

In the Title, change "CONFIGURED" to --CONFIGURATED--;

Column 1, Line 27, delete "various";

Column 1, Line 52, after "cells" insert --11A--;

Column 4, Line 7, change "through" to --(through--;

Column 4, Line 7, after "wiring" change "layer" to --layer)--;

Column 6, Line 66, delete "film";

UNITED STATES PATENT AND TRADEMARK OFFICE
CERTIFICATE OF CORRECTION

PATENT NO.    :   4,974,049

DATED         :   November 27, 1990

INVENTOR(S)   :   Akihiro Sueda et al.

It is certified that error appears in the above-identified patent and that said Letters Patent is hereby corrected as shown below:

Claim 1, Column 9, Line 3, change "included" to --including--.

Signed and Sealed this

Third Day of November, 1992

Attest:

DOUGLAS B. COMER

*Attesting Officer*       *Acting Commissioner of Patents and Trademarks*